United States Patent
Tian et al.

(10) Patent No.: US 10,581,264 B2
(45) Date of Patent: Mar. 3, 2020

(54) ADAPTER AND CHARGING CONTROL METHOD

(71) Applicant: GUANGDONG OPPO MOBILE TELECOMMUNICATIONS CORP., LTD., Dongguan (CN)

(72) Inventors: Chen Tian, Dongguan (CN); Jialiang Zhang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/561,713

(22) PCT Filed: Jan. 7, 2017

(86) PCT No.: PCT/CN2017/070516
§ 371 (c)(1),
(2) Date: Sep. 26, 2017

(87) PCT Pub. No.: WO2017/133379
PCT Pub. Date: Aug. 10, 2017

(65) Prior Publication Data
US 2018/0358836 A1    Dec. 13, 2018

Related U.S. Application Data (63) Continuation-in-part of application No. PCT/CN2016/073679, filed on Feb. 5, 2016.

(30) Foreign Application Priority Data

Jul. 26, 2016   (CN) .......................... 2016 1 0600612

(51) Int. Cl.
*H02J 7/00*      (2006.01)
*H02J 7/02*      (2016.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC ...... H02J 7/022; H02J 7/00; H02J 7/02; H02J 7/04; H02J 7/12; H02J 7/14;
(Continued)

(56) References Cited

U.S. PATENT DOCUMENTS

| 4,087,733 A | 5/1978 | Casagrande |
| 6,025,695 A | 2/2000 | Friel et al. |

(Continued)

FOREIGN PATENT DOCUMENTS

| CN | 202026118 U | 11/2011 |
| CN | 102364848 A | 2/2012 |

(Continued)

OTHER PUBLICATIONS

Japanese Patent Application No. 2018508703, Office Action dated Jul. 31, 2018, 9 pages.
(Continued)

*Primary Examiner* — Vuthe Siek
(74) *Attorney, Agent, or Firm* — Lathrop GPM LLP (57) ABSTRACT

An adapter (10) and a charging control method, the adapter (10) comprising: a power conversion unit (11), used for converting an inputted alternating current so as to obtain an output voltage and an output current of the adapter (10), the output current of the adapter (10) being an alternating current or a pulsed direct current; a voltage holding unit (12), an input end of the voltage holding unit (12) being connected to the power conversion unit (11), the voltage holding unit (12) being used for obtaining an input voltage having a pulsed waveform from the power conversion unit (11) and converting the input voltage having the pulsed
(Continued)

waveform into a target voltage, an output end of the voltage holding unit (12) being connected to a device in the adapter (10), the target voltage being used to power the device in the adapter (10), a peak value of the target voltage being between the lowest operating voltage and the highest operating voltage of the device. The adapter (10) reduces lithium separation in batteries, and increases the service life of batteries.

18 Claims, 3 Drawing Sheets

(51) Int. Cl.
| | |
|---|---|
| H02J 7/04 | (2006.01) |
| H02J 7/06 | (2006.01) |
| H02J 7/10 | (2006.01) |
| H02J 7/18 | (2006.01) |
| H02J 7/24 | (2006.01) |
| H02J 7/14 | (2006.01) |
| H02J 7/08 | (2006.01) |
| G01R 31/3842 | (2019.01) |
| G01R 31/3835 | (2019.01) |
| G01R 29/12 | (2006.01) |
| G01R 15/14 | (2006.01) |
| G01R 19/25 | (2006.01) |
| G01R 19/04 | (2006.01) |
| H02M 7/04 | (2006.01) |
| H02M 5/04 | (2006.01) |
| H02M 7/06 | (2006.01) |
| H02M 3/335 | (2006.01) |
| H02M 7/217 | (2006.01) |
| H02M 3/156 | (2006.01) |
| H02M 1/00 | (2006.01) |
| H01M 10/44 | (2006.01) |
| H01M 10/42 | (2006.01) |
| H01M 10/0525 | (2010.01) |
| H03M 1/66 | (2006.01) |
| H01F 27/40 | (2006.01) |
| H01F 27/42 | (2006.01) |
| H02M 1/08 | (2006.01) |
| H02M 1/44 | (2007.01) |

(52) U.S. Cl.
CPC ......... *H01M 10/425* (2013.01); *H01M 10/44* (2013.01); *H02J 7/00* (2013.01); *H02J 7/007* (2013.01); *H02J 7/008* (2013.01); *H02J 7/0029* (2013.01); *H02J 7/0031* (2013.01); *H02J 7/0071* (2020.01); *H02J 7/00711* (2020.01); *H02J 7/007192* (2020.01); *H02J 7/022* (2013.01); *H02J 7/04* (2013.01); *H02J 7/045* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 10/4257* (2013.01); *H01M 2010/4271* (2013.01); *H02J 7/00034* (2020.01); *H02J 7/00304* (2020.01); *H02J 2007/0062* (2013.01); *H02J 2007/10* (2013.01); *H02J 2207/20* (2020.01); *H02M 2001/0009* (2013.01)

(58) Field of Classification Search
CPC ....... H02J 2007/0039; H02J 2007/0059; H02J 2007/0062; H02J 2007/0096; H02J 2007/0098; H02J 2007/10; H02J 7/0029; H02J 7/0031; H02J 7/0052; H02J 7/007; H02J 7/008; H02J 7/0093; H02J 7/027; H02J 7/041; H02J 7/045; H02J 7/047; H02J 7/06; H02M 1/44; H02M 5/04; H02M 7/04; H02M 1/08; H02M 2001/0009; H02M 3/335; H02M 3/33507; H02M 3/33523; H02M 3/33569; H02M 3/33576; H02M 3/33592; H02M 7/06; H02M 7/217; G01R 31/3842; G01R 31/3835; G01R 19/25; G01R 19/04; H01M 10/0525; H01M 10/425; H01M 10/42; H01M 10/44; H01M 2010/4271; H03M 1/66

See application file for complete search history.

(56) References Cited

U.S. PATENT DOCUMENTS

| | | | |
|---|---|---|---|
| 6,137,265 A | 10/2000 | Cummings et al. | |
| 6,844,705 B2 | 1/2005 | Lai et al. | |
| 6,909,617 B1 | 6/2005 | Mirskiy | |
| 9,087,656 B1* | 7/2015 | Vinciarelli | ............... H01H 9/54 |
| 2004/0090209 A1 | 5/2004 | Nishida et al. | |
| 2006/0284595 A1 | 12/2006 | Hsieh et al. | |
| 2008/0197811 A1 | 8/2008 | Hartular et al. | |
| 2013/0141034 A1 | 6/2013 | Huang et al. | |
| 2014/0035530 A1 | 2/2014 | Shao | |
| 2015/0263638 A1 | 9/2015 | Yang | |
| 2016/0105038 A1* | 4/2016 | Chi | ......................... H02J 7/007 |
| | | | 320/107 |
| 2017/0040810 A1 | 2/2017 | Hu et al. | |

FOREIGN PATENT DOCUMENTS

| | | |
|---|---|---|
| CN | 102447283 A | 5/2012 |
| CN | 102545360 A | 7/2012 |
| CN | 102723880 A | 10/2012 |
| CN | 102364856 B | 10/2013 |
| CN | 103762702 A | 4/2014 |
| CN | 103795040 A | 5/2014 |
| CN | 104917271 A | 6/2015 |
| CN | 104767260 A | 7/2015 |
| CN | 104810877 A | 7/2015 |
| CN | 104810879 A | 7/2015 |
| CN | 104967199 A | 10/2015 |
| CN | 104967201 A | 10/2015 |
| CN | 105098900 A | 11/2015 |
| CN | 106026327 A | 10/2016 |
| EP | 2228884 A2 | 9/2010 |
| EP | 2887492 A | 6/2015 |
| EP | 2930589 A1 | 10/2015 |
| EP | 2980958 A1 | 2/2016 |
| JP | S502047 A | 1/1975 |
| JP | H07099778 A | 4/1995 |
| JP | 2010115087 A | 5/2010 |
| JP | 2013198262 A | 9/2013 |
| JP | 5454781 B2 | 3/2014 |
| JP | 2014161146 A | 9/2014 |
| JP | 5822304 B2 | 11/2015 |
| TW | 200616305 A | 5/2006 |
| TW | M481439 U | 7/2014 |
| WO | WO 2012167677 A1 | 12/2012 |
| WO | WO 2015113341 A1 | 8/2015 |
| WO | WO 2015113349 A1 | 8/2015 |

OTHER PUBLICATIONS

Japanese Patent Application No. 2018508703, English translation of Office Action dated Jul. 31, 2018, 10 pages.
Australian Patent Application No. 2016291545 Office Action dated Jun. 25, 2018, 6 pages.

(56) References Cited

OTHER PUBLICATIONS

European Patent Application No. 16819788.7 extended Search and Opinion dated Nov. 15, 2017, 7 pages.
Korean Patent Application No. 20177002310 Office Action dated Jan. 29, 2018, 5 pages.
Korean Patent Application No. 20177002310 English translation of Office Action dated Jan. 29, 2018, 3 pages.
Korean Patent Application No. 20177002310 Office Action dated Jun. 26, 2018, 3 pages.
Korean Patent Application No. 20177002310 English translation of Office Action dated Jun. 26, 2018, 3 pages.
Singapore Patent Application No. 11201700428U Search and Opinion dated Nov. 23, 2017, 9 pages.
Taiwan Patent Application No. 105120040 Office Action dated Aug. 8, 2017, 11 pages.
Taiwan Patent Application No. 105120040 Decision to Grant Patent dated Mar. 22, 2018, 2 pages.
PCT/CN2016/073679 International Search Report and Written Opinion dated Nov. 10, 2016, 12 pages.
PCT/CN2016/073679 English translation of International Search Report and Written Opinion dated Nov. 10, 2016, 8 pages.
Chen, Liang-Rui, 'A Design of an Optimal Battery Pulse Charge System by Frequency-Varied Technique', IEEE Transactions on Industrial Electronics, vol. 54, No. 1, Feb. 2007, pp. 398-405, cited in office action in AU application No. 2016291545.
Taiwan Patent Application No. 106124406 Office Action dated Oct. 4, 2018, 5 pages.
Japanese Patent Application No. 2018508703 Office Action dated Nov. 13, 2018, 10 pages.
Japanese Patent Application No. English translation of 2018508703 Office Action dated Nov. 13, 2018, 7 pages.
PCT/CN2017/070516 International Search Report and Written Opinion dated Jun. 30, 2017, 15 pages.
PCT/CN2017/070516 English translation of Written Opinion dated Jun. 30, 2017, 5 pages.
PCT/CN2017/070516 English translation of International Search Report dated Jun. 30, 2017, 2 pages.
European Patent Application No. 17746699.2 extended Search and Opinion dated Feb. 11, 2019, 8 pages.
Indian Patent Application No. 201837005438 Office Action dated Oct. 23, 2019, 6 pages.

* cited by examiner

ADAPTER AND CHARGING CONTROL METHOD

CROSS-REFERENCE TO RELATED APPLICATIONS

This application is a US national phase application based up an International Application No. PCT/CN2017/070516, filed on Jan. 7, 2017, which claims priority to PCT/CN2016/073679 filed Feb. 5, 2016, and Chinese Application No. 201610600612.3 filed Jul. 26, 2016, the entire contents of which are incorporated herein by reference.

TECHNICAL FIELD

Embodiments of the present disclosure generally relates to charging technical field, and more particularly, to an adapter, and a charging control method.

BACKGROUND

An adapter, also called as a power adapter, is configured to charge a device to be charged (such as a terminal). Nowadays, the adapter on the market typically charges the device to be charged (such as the terminal) in a constant voltage mode. Since a battery in the device to be charged is typically a lithium battery, it is easy to cause lithium precipitation when the device to be charged is charged in the constant voltage made, thus shortening service lifespan of the battery.

SUMMARY

An adapter is provided. The adapter includes a power conversion unit and a voltage holding unit. The power conversion unit is configured to convert an input alternating current to obtain an output voltage and an output current of the adapter, in which the output current of the adapter is an alternating current or a pulsating direct current. The voltage holding unit has an input end coupled to the power conversion unit, and is configured to obtain an input voltage with a pulsating waveform from the power conversion unit and to convert the input voltage with the pulsating waveform into a target voltage. An output end of the voltage holding unit is coupled to a component in the adapter such that the component is powered by the target voltage, in which a peak value of the target voltage is between a lowest operation voltage value and a highest operation voltage value of the component.

A charging control method is provided. The charging control method is applied in an adapter. The adapter includes a power conversion unit configured to convert an input alternating current to obtain an output voltage and an output current of the adapter, in which the output current of the adapter is an alternating current or a pulsating direct current. The method includes: obtaining an input voltage with a pulsating waveform from the power conversion unit, and converting the input voltage with the pulsating waveform into a target voltage, in which a peak value of the target voltage is between a lowest operation voltage value and a highest operation voltage value of a component in the adapter; and powering the device using the target voltage.

BRIEF DESCRIPTION OF THE DRAWINGS

In order to illustrate the technical solutions of embodiments of the present disclosure more clearly, the accompanying drawings used in the description of embodiments of the present disclosure are briefly described hereunder. Obviously, the described drawings are merely some embodiments of present disclosure. For those skilled in the art, other drawings may be obtained based on these drawings without any creative work.

DETAILED DESCRIPTION

The technical solutions in embodiments of the present disclosure are hereinafter described clearly and completely with reference to the accompanying drawings in embodiments of the present disclosure. It should be understood that, embodiments described herein are a part of embodiments of the present disclosure, but not all. Based on embodiments of the present disclosure, all other embodiments obtained by those skilled in the art without creative work should fall within the scope of the present disclosure.

In the related art, a first adapter configured to charge a device to be charged (such as a terminal) is presented. The first adapter is suitable for working in a constant voltage mode. In the constant voltage mode, a voltage outputted by the first adapter is basically constant, such as 5V, 9V, 12V or 20V, etc.

The voltage outputted by the first adapter is unsuitable for being directly applied to both ends of a battery. It is required to convert the voltage by a conversion circuit in the device to be charged (such as the terminal) to obtain a charging voltage and/or a charging current expected by the battery in the device to be charged (such as the terminal).

The conversion circuit is configured to convert the voltage outputted by the first adapter, so as to meet requirements for the charging voltage and/or the charging current expected by the battery.

As an example, the conversion circuit may be a charging management module, such as a charging integrated circuit (IC). During a process of charging the battery, the conversion circuit may be configured to manage the charging voltage and/or the charging current of the battery. The conversion circuit has a voltage feedback function and/or a current feedback function, so as to realize management on the charging voltage and/or the charging current of the battery.

For example, the process of charging the battery may include at least one of a trickle charging stage, a constant current charging stage and a constant voltage charging stage. In the trickle charging stage, the conversion circuit may be configured to utilize a current feedback loop to ensure that current flowing into the battery in the trickle charging stage meets the charging current (such as a first charging current) expected by the battery. In the constant current charging stage, the conversion circuit may be configured to utilize a current feedback loop to ensure that current flowing into the battery in the constant current charging stage meets the charging current (such as a second charging current, which may be greater than the first charging current) expected by the battery. In the constant voltage charging stage, the conversion circuit may be configured to utilize a voltage feedback loop to ensure that voltage applied to both ends of the battery in the constant voltage charging stage meets the charging voltage expected by the battery.

As an example, when the voltage outputted by the first adapter is greater than the charging voltage expected by the battery, the conversion circuit may be configured to perform a buck conversion on the voltage outputted by the first adapter, such that a buck-converted voltage meets the requirement of the charging voltage expected by the battery. As another example, when the voltage outputted by the first adapter is less than the charging voltage expected by the battery, the conversion circuit may be configured to perform a boost conversion on the voltage outputted by the first adapter, such that a boost-converted voltage meets the requirement of the charging voltage expected by the battery.

As another example, assume that the first adapter outputs a constant voltage of 5V. When the battery includes a single battery cell (such as a lithium battery cell, a charging cut-off voltage of the single battery cell is 4.2V), the conversion circuit (for example, a buck circuit) may perform the buck conversion on the voltage outputted by the first adapter, such that the charging voltage obtained after the buck conversion meets the requirement of the charging voltage expected by the battery.

As yet another example, assume that the first adapter outputs a constant voltage of 5V. When the first adapter charges two or more battery cells (such as a lithium battery cell, a charging cut-off voltage of the single battery cell is 4.2V) coupled in series, the conversion circuit (for example, a boost circuit) may perform the boost conversion on the voltage outputted by the first adapter, such that the charging voltage obtained after the boost conversion meets the requirement of the charging voltage expected by the battery.

Limited by a poor conversion efficiency of the conversion circuit, a part of electric energy is lost in a form of heat, and this part of heat may gather inside the device to be charged (such as the terminal). A design space and a space for heat dissipation of the device to be charged (such as the terminal) are small (for example, a physical size of a mobile terminal used by a user becomes thinner and thinner, while plenty of electronic components are densely arranged in the mobile terminal to improve a performance of the mobile terminal), which not only increases a difficulty in designing the conversion circuit, but also results in that it is hard to dissipate the heat gathered in the device to be charged (such as the terminal) in time, thus further causing an abnormity of the device to be charged (such as the terminal).

For example, heat gathered on the conversion circuit may cause a thermal interference on electronic components neighboring the conversion circuit, thus causing abnormal operations of the electronic components. For another example, heat gathered on the conversion circuit may shorten service lifespan of the conversion circuit and neighboring electronic components. For yet another example, heat gathered on the conversion circuit may cause a thermal interference on the battery, thus causing abnormal charging and discharging of the battery. For still another example, heat gathered on the conversion circuit may increase a temperature of the device to be charged (such as the terminal), thus affecting user experience during the charging. For still yet another example, heat gathered on the conversion circuit may short-circuit the conversion circuit, such that the voltage outputted by the first adapter is directly applied to both ends of the battery, thus causing over-voltage charging of the battery, which even brings safety hazard, for example, the battery may explode, if the over-voltage charging lasts for a long time period.

Embodiments of the present disclosure provide a second adapter, an output voltage of which is adjustable. The second adapter may obtain status information of the battery. The status information of the battery may include electric quantity information and/or voltage information of the battery. The second adapter may adjust the voltage outputted by itself according to the obtained status information of the battery, to meet the requirement of the charging voltage and/or the charging current expected by the battery. Further, during the constant current charging stage of the battery charging process, the voltage outputted by the second adapter after the adjustment may be directly applied to both ends of the battery for charging the battery.

The second adapter may have a voltage feedback function and/or a current feedback function, so as to realize management on the charging voltage and/or the charging current of the battery.

In some embodiments, the second adapter may adjust the voltage outputted by itself according to the obtained status information of the battery as follows. The second adapter may obtain the status information of the battery in real time, and adjust the voltage outputted by itself according to the status information of the battery obtained in real time, to meet the charging voltage and/or the charging current expected by the battery.

The second adapter may adjust the voltage outputted by itself according to the status information of the battery obtained in real time as follows. With the increasing of the voltage of the battery during the charging process, the second adapter may obtain status information of the battery at different time points in the charging process, and adjust the voltage outputted by itself in real time according to the status information of the battery, to meet the requirement of the charging voltage and/or the charging current expected by the battery.

For example, the process of charging the battery may include at least one of a trickle charging stage, a constant current charging stage and a constant voltage charging stage. In the trickle charging stage, the second adapter may be configured to utilize the current feedback loop to ensure that the current outputted by the second adapter and flowing into the battery in the trickle charging stage meets the requirement of the charging current expected by the battery (such as the first charging current). In the constant current charging stage, the second adapter may be configured to utilize the current feedback loop to ensure that the current outputted by the second adapter and flowing into the battery in the constant current charging stage meets the requirement of the charging current expected by the battery (such as the second charging current, the second charging current may be greater than the first charging current). Moreover, in the constant current charging stage, the charging voltage outputted by the second adapter may be directly applied to both ends of the battery for charging the battery. In the constant voltage charging stage, the second adapter may be configured to utilize the voltage feedback loop to ensure that voltage outputted by the second adapter meets the requirement for charging voltage expected by the battery.

In the trickle charging stage and the constant voltage charging stage, the voltage outputted by the second adapter may be processed in the same manner as the first adapter, i.e., the voltage is converted by the conversion circuit in the device to be charged (such as the terminal) to obtain the charging voltage and/or the charging current expected by the battery in the device to be charged (such as the terminal).

Figure 1:
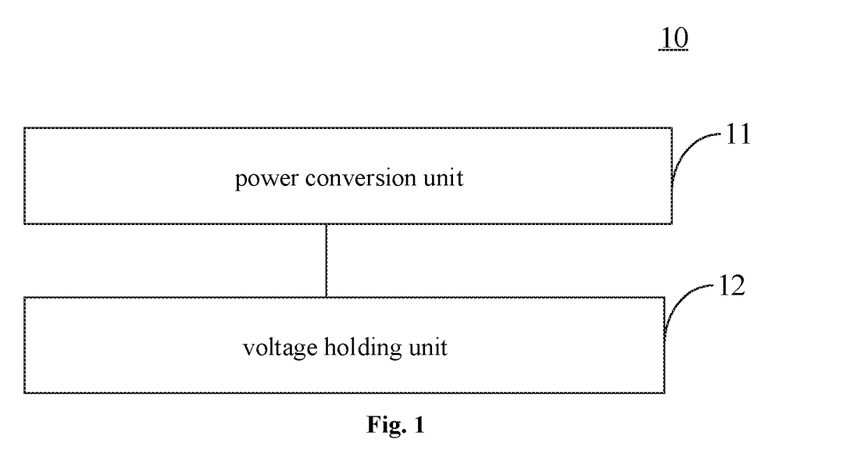
FIG. 1 is a block diagram illustrating a second adapter according to an embodiment of the present disclosure.

FIG. 1 is a block diagram illustrating a second adapter according to embodiments of the present disclosure. The second adapter 10 illustrated in FIG. 1 includes a power conversion unit 11 and a voltage holding unit 12.

The power conversion unit 11 is configured to convert an input alternating current to obtain an output voltage and an output current of the second adapter 10. The output current of the second adapter 10 is an alternating current or a pulsating direct current.

An input end of the voltage holding unit 12 is coupled to the power conversion unit 11. The voltage holding unit 12 is configured to obtain an input voltage with a pulsating waveform from the power conversion unit 11 and to convert the input voltage with the pulsating waveform into a target voltage. An output end of the voltage holding unit 12 is coupled to a component in the second adapter 10, such that the target voltage powers the device. A peak value of the target voltage is between a lowest operation voltage value and a highest operation voltage value of the device.

In embodiments of the present disclosure, the output current of the second adapter is the alternating current or the pulsating direct current. The alternating current or the pulsating direct current may reduce the lithium precipitation of the battery, reduce a probability and an intensity of arc discharge of a contact of a charging interface, and improve service lifespan of the charging interface.

In addition, a supply voltage of some components in the second adapter is provided by VBUS (or bus) of the second adapter. If a voltage on VBUS is too low when the second adapter charges the device to be charged (such as the terminal), it may lead to that these components enter an under-voltage protection state and cannot work properly. In view of this, the voltage holding unit 12 is introduced into the second adapter in the embodiments of the present disclosure, and the voltage holding unit 12 is capable of converting the input voltage with the pulsating waveform obtained from the power conversion unit 11 into the target voltage that satisfies the normal operation of the devices, such that the components in the second adapter may work properly.

In some embodiments, the second adapter 10 may be configured to operate in a constant current mode. That is, in the constant current mode, the second adapter 10 may use the alternating current or the pulsating direct current to charge the device to be charged (such as the terminal).

In the constant current mode, the output voltage of VBUS will constantly match the battery voltage of the device to be charged (such as the terminal). That is, the output voltage of VBUS will increase with increasing of the voltage across two ends of the battery. When the battery voltage is low, the output voltage of VBUS is generally low. In this case, the components powered by VBUS cannot work properly because the output voltage of VBUS is too low, thereby resulting in a failure of a charging process of the second adapter. Based on the voltage holding unit 12, embodiments of the present disclosure ensure that the components in the second adapter can operate normally in the constant current mode.

It should be noted that, embodiments of the present disclosure does not specifically limit a manner of outputting the alternating current or the pulsating direct current by the second adapter. In detail, in some embodiments, a current coupled to a secondary side from a primary side of the power conversion unit 11 may be directly outputted or may be outputted after a simple processing, and in this case, the output current of the second adapter may be the alternating current. In other embodiments, the current coupled to the secondary side from the primary side of the power conversion unit 11 may be rectified, and then the rectified current may be outputted after a simple processing, and in this case, the output current of the second adapter may be the pulsating direct current.

It should be noted that, the pulsating direct current can also be called as the output current with one-way pulses, the current with the pulsating waveform, or the current with steamed bun waveform.

Figure 2A:
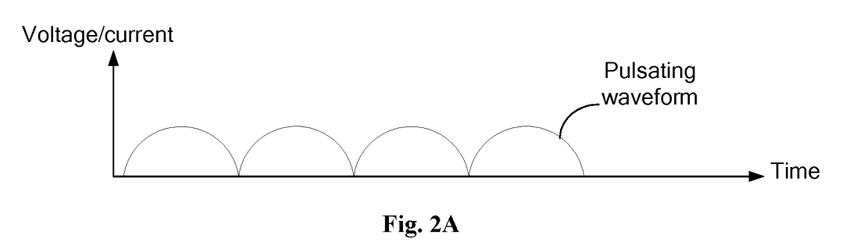
FIG. 2A and FIG. 2B are schematic diagrams each illustrating a pulsating waveform according to an embodiment of the present disclosure.
Figure 2B:
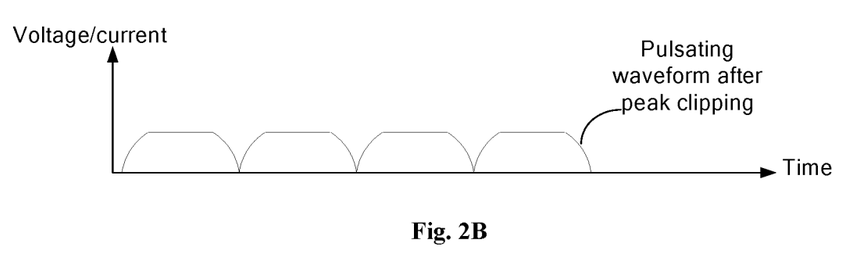

When the second adapter 10 outputs the current with the pulsating waveform, the pulsating waveform herein may be a complete pulsating waveform or a pulsating waveform obtained after performing a peak clipping process on the complete pulsating waveform. The peak clipping process refers to that, a part of the pulsating waveform which exceeds a certain threshold is filtered out to realize the control on the peak value of the pulsating waveform. In an embodiment illustrated in FIG. 2A, the pulsating waveform is a complete waveform. In an embodiment illustrated in FIG. 2B, the pulsating waveform is obtained after performing the peak clipping process.

In addition, in some embodiments, the second adapter 10 may also output a constant direct current (or a current with a constant current value). In detail, the current coupled to the secondary side from the primary side of the power conversion unit 11 may be rectified, filtered and then outputted, and then the output current of the second adapter may be the constant direct current.

In some embodiments, the power conversion unit 11 includes a primary unit and a secondary unit. The voltage holding unit 12 is coupled to the secondary unit of the power conversion unit 11 and is configured to convert the voltage with the pulsating waveform, which is coupled to the secondary unit from the primary unit, into the target voltage to power the component in the second adapter.

In some embodiments, the voltage holding unit 12 may also be coupled to the primary unit of the power conversion unit 11. That is, the voltage holding unit 12 may directly convert the voltage in the primary unit into the target voltage to power the component in the second adapter.

The voltage holding unit 12 in the embodiments of the present disclosure may supply power for one or more components in the second adapter.

In addition, the output end of the voltage holding unit 12 in the embodiments of the present disclosure may be directly coupled to the component in the second adapter or may be coupled to the component in the second adapter through a voltage dividing circuit, so as to supply power to the component in the second adapter.

In some embodiments, the voltage holding unit 12 includes a rectifying unit and a filter unit. An input end of the rectifying unit is coupled to the secondary unit. The rectifying unit is configured to rectify a current of the secondary unit to obtain a pulsating current and voltage. An input end of the filter unit is coupled to an output end of the rectifying unit and an output end of the filter unit is coupled to the component in the second adapter 10. The filter unit is configured to convert the pulsating voltage into the target voltage and to supply power to the component in the second adapter 10 based on the target voltage.

Figure 3:
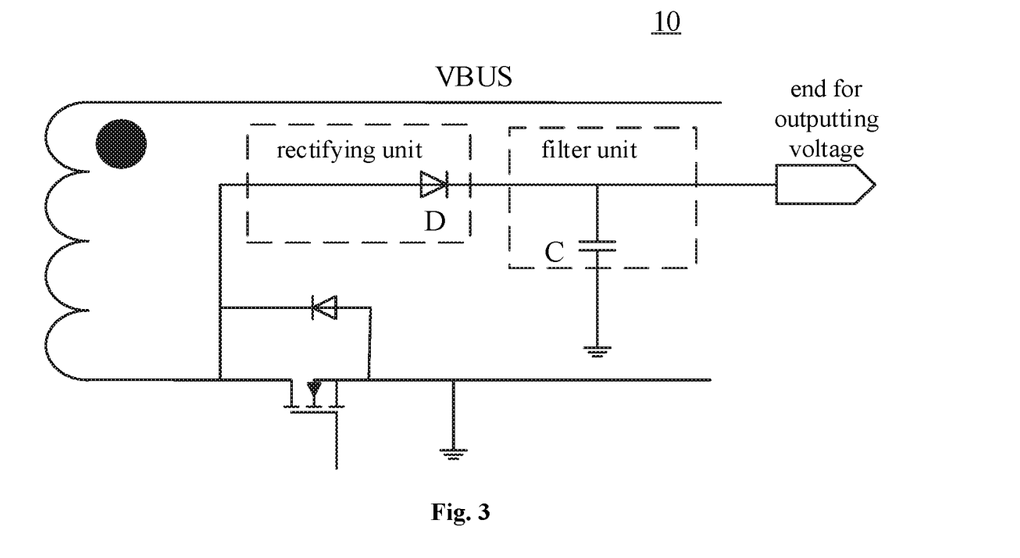
FIG. 3 is a block diagram illustrating a second adapter according to another embodiment of the present disclosure.

In some embodiments, as illustrated in FIG. 3, the rectifying unit may include a diode, an anode of the diode is coupled to the secondary unit, and a cathode of the diode is coupled to the input end of the filter unit. The filter unit may include a capacitor, one end of the capacitor is coupled to the output end of the rectifying unit and the component in the second adapter respectively, and the other end of the capacitor is grounded. There may be one or more capacitors in the filter unit, which is not limited in embodiments of the present disclosure.

In some embodiments, a capacity of the capacitor and/or the number of capacitors in the filter unit is determined based on power consumption of the component in the second adapter. For example, when the power consumption of the component in the second adapter is larger, the capacity of the capacitor and/or the number of capacitors in the filter unit can be increased, and if the power consumption of the component in the second adapter is smaller, the capacity of the capacitor and/or the number of capacitors in the filter unit can be decreased.

In some embodiments, the second adapter 10 may be configured to operate in a constant current mode. In detail, when the second adapter 10 charges the device to be charged (e.g., the terminal) in the constant current mode, the output voltage of VBUS of the second adapter 10 is only slightly higher than the voltage across both ends of the battery of the device to be charged (e.g., the terminal), and the output voltage of VBUS is gradually increased in the charging process. Therefore, at an initial stage of charging, the output voltage of VBUS is low and may not meet the power requirements of some components. For example, at a certain time, the voltage across both ends of the battery of the device to be charged (such as the terminal) is 1.5V, the output voltage of VBUS is 1.7V, and a minimum operation voltage of one of the components in the second adapter is 3.3V, and then the output voltage of VBUS is less than the minimum operation voltage of this component at this time and cannot meet the power requirements of this component. Therefore, when the second adapter uses the constant current mode to charge the device to be charged (such as the terminal), VBUS cannot be used to power the components in the second adapter. The second adapter of embodiments of the present disclosure directly converts the input voltage obtained from the power conversion unit into the target voltage required by the operation of the components in the second adapter. Therefore, both in the constant current mode and in the constant voltage mode, stable operation voltage may be provided for the components in the second adapter.

In some embodiments, the second adapter 10 may further include a transformer. A winding ratio of a primary winding and a secondary winding of the transformer is determined based on a peak value of the target voltage. In detail, the peak value of the target voltage may increase as the winding ratio increases. When it is desired to increase the peak value of the target voltage, the winding ratio of the primary and secondary windings of the transformer may be increased.

The second adapter 10 of embodiments of the present disclosure may charge the device to be charged, such as the terminal. The device to be charged applied in embodiments of the present disclosure may be a "communication terminal" (or "terminal" for short). The device to be charged includes, but is not limited to a device configured to receive/transmit communication signals via wired connection (for example, public switched telephone network (PSTN), digital subscriber line (DSL), digital cable, direct cable connection and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal. The communication terminal configured to communicate via the wireless interface may be referred to as "wireless communication terminal", "wireless terminal" and/or "mobile terminal". Examples of the mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, an Internet/Intranet access, a web browser, a notepad & address book, a calendar and/or a global positioning system (GPS) receiver, and a common laptop and/or handheld receiver, or other electronic devices including a radio phone transceiver.

In some embodiments, the second adapter 10 may include a charging interface. However, a type of the charging interface is not limited in embodiments of the present disclosure. For example, the charging interface may be a universal serial bus (USB) interface, which may be a common USB interface or a micro USB interface, or a Type-C interface.

In some embodiments, the second adapter 10 may support a first charging mode and a second charging mode. A charging speed of the second adapter 10 charging the device to be charged (such as the terminal) in the second charging mode is greater than a charging speed of the second adapter 10 charging the device to be charged (such as the terminal) in the first charging mode. In other words, compared to the second adapter 10 working in the first charging mode, the second adapter 10 working in the second charging mode can fully charge the battery having the same capacity in the device to be charged (such as the terminal) in a shorter time period.

The second adapter 10 includes a control unit. During the second adapter 10 is coupled to the device to be charged (such as the terminal), the control unit performs bidirectional communication with the device to be charged (such as the terminal) to control the charging process in the second charging mode. The control unit may be any of the control units described in embodiments.

The first charging mode is a normal charging mode and the second charging mode is a fast charging mode. Under the normal charging mode, the second adapter outputs a relatively small current (typically less than 2.5 A) or charges the battery in the device to be charged (such as the terminal) with a relatively small power (typically less than 15 W). In the normal charging mode, it may take several hours to fully charge a larger capacity battery (such as a battery with 3000 mAh). In contrast, under the fast charging mode, the second adapter outputs a relatively large current (typically greater than 2.5 A, such as 4.5 A, 5 A or higher) or charges the battery in the device to be charged (such as the terminal) with a relatively large power (typically greater than or equal to 15 W). Compared to the normal charging mode, the charging speed of the second adapter in the fast charging mode is faster, and the charging time required for fully charging a battery with a same capacity in the fast charging mode may be significantly shortened.

The communicated content between the control unit of the second adapter and the device to be charged (such as the terminal) is not limited in embodiments of the present disclosure, and the control method of the control unit on the output of the second adapter in the second charging mode is also not limited in embodiments of the present disclosure. For example, the control unit may communicate with the device to be charged (such as the terminal) to obtain the present voltage or present electric quantity of the battery in the device to be charged (such as the terminal), and adjust the output voltage or output current of the second adapter based on the present voltage or present electric quantity of the battery. In the following, the communicated content between the control unit and the device to be charged (such as the terminal) and the control method of the control unit on the output of the second adapter in the second charging mode will be described in detail in combination with specific embodiments.

In some embodiments, the control unit performs the bidirectional communication with the device to be charged (such as the terminal) to control the output of the second adapter in the second charging mode as follows. The control unit performs the bidirectional communication with the device to be charged (such as the terminal) to negotiate the charging mode between the second adapter and the device to be charged (such as the terminal).

In embodiments of the present disclosure, the second adapter does not perform a fast charging on the device to be charged (such as the terminal) in the second charging mode blindly, but performs the bidirectional communication with the device to be charged (such as the terminal) to negotiate whether the second adapter can perform the fast charging on the device to be charged (such as the terminal) in the second charging mode. In this way, safety of charging process can be improved.

In detail, the control unit performs the bidirectional communication with the device to be charged (such as the terminal) to negotiate the charging mode between the second adapter and the device to be charged (such as the terminal) as follows. The control unit sends a first instruction to the device to be charged (such as the terminal), in which the first instruction is configured to query the device to be charged (such as the terminal) whether to operate in the second charging mode. The control unit receives a reply instruction replying the first instruction and sent by the device to be charged (such as the terminal), in which the reply instruction replying the first instruction is configured to indicate whether the device to be charged (such as the terminal) agrees to operate in the second charging mode. When the device to be charged (such as the terminal) agrees to operate in the second charging mode, the control unit charges the device to be charged (such as the terminal) in the second charging mode.

The master-slave relation of the second adapter (or the control unit in the second adapter) and the device to be charged (such as the terminal) is not limited in embodiments of the present disclosure. In other words, any of the control unit and the device to be charged (such as the terminal) can be configured as the master device for initiating the bidirectional communication session, accordingly, the other one can be configured as the slave device for making a first response or a first reply to the communication initiated by the master device. As a feasible implementation, during the communication, the identifications of the master device and the slave device can be determined by comparing the electrical levels of the second adapter and the device to be charged (such as the terminal) relative to the ground.

The specific implementation of bidirectional communication between the second adapter (or the control unit in the second adapter) and the device to be charged (such as the terminal) is not limited in embodiments of the present disclosure. In other words, any of the second adapter (or the control unit in the second adapter) and the device to be charged (such as the terminal) can be configured as the master device for initiating the bidirectional communication session, accordingly, the other one can be configured as the slave device making a first response or a first reply to the communication initiated by the master device, and the master device is able to make a second response to the first response or the first reply of the slave device, and thus a negotiation about a charging mode can be realized between the master device and the slave device. As a feasible implementation, a charging operation between the master device and the slave device is performed after a plurality of negotiations about the charging mode are completed between the master device and the slave device, such that the charging process can be performed safely and reliably after the negotiation.

As an implementation, the master device is able to make a second response to the first response or the first reply made by the slave device to the communication session in a manner that, the master device is able to receive the first response or the first reply made by the slave device to the communication session and to make a targeted second response to the first response or the first reply. As an example, when the master device receives the first response or the first reply made by the slave device to the communication session in a predetermined time period, the master device makes the targeted second response to the first response or the first reply of the slave device in a manner that, the master device and the slave device complete one negotiation about the charging mode, and a charging process may be performed between the master device and the salve device in the first charging mode or the second charging mode, i.e., the second adapter charges the device to be charged (such as the terminal) in the first charging mode or the second charging mode according to a negotiation result.

As another implementation, the master device is able to make a second response to the first response or the first reply made by the slave device to the communication session in a manner that, when the master device does not receive the first response or the first reply made by the slave device to the communication session in the predetermined time period, the master device also makes the targeted second response to the first response or the first reply of the slave device. As an example, when the master device does not receive the first response or the first reply made by the slave device to the communication session in the predetermined time period, the master device makes the targeted second response to the first response or the first reply of the slave device in a manner that, the master device and the slave device complete one negotiation about the charging mode, the charging process is performed between the master device and the slave device in the first charging mode, i.e., the second adapter charges the device to be charged (such as the terminal) in the first charging mode.

In some embodiments, when the device to be charged (such as the terminal) is configured as the master device for initiating the communication session, after the second adapter (or the control unit in the second adapter) configured as the slave device makes the first response or the first reply to the communication session initiated by the master device, it is unnecessary for the device to be charged (such as the terminal) to make the targeted second response to the first response or the first reply of the second adapter, i.e., one negotiation about the charging mode is regarded as completed between the second adapter (or the control unit in the second adapter) and the device to be charged (such as the terminal), and the second adapter is able to charge the device to be charged (such as the terminal) in the first charging mode or the second charging mode according to the negotiation result.

In some embodiments, the control unit performs the bidirectional communication with the device to be charged (such as the terminal) to control the output of the second adapter in the second charging mode as follows. The control unit performs the bidirectional communication with the device to be charged (such as the terminal) to determine a charging voltage outputted by the second adapter in the second charging mode for charging the device to be charged (such as the terminal). The control unit adjusts the output voltage of the second adapter (or a peak value of the output voltage of the second adapter), such that the output voltage of the second adapter (or a peak value of the output voltage of the second adapter) is equal to the charging voltage outputted by the second adapter in the second charging mode for charging the device to be charged (such as the terminal).

In detail, the control unit performs the bidirectional communication with the device to be charged (such as the terminal) to determine the charging voltage outputted by the adapter in the second charging mode for charging the device to be charged (such as the terminal) as follows. The control unit sends a second instruction to the device to be charged (such as the terminal), in which the second instruction is configured to query whether the output voltage of the second adapter matches with the present voltage of the battery of the device to be charged (such as the terminal). The control unit receives a reply instruction replying the second instruction and sent by the device to be charged (such as the terminal), in which the reply instruction replying the second instruction is configured to indicate that the output voltage of the second adapter matches with the present voltage of the battery, or is higher or lower than the present voltage of the battery. In another embodiment, the second instruction can be configured to query whether the present output voltage of the second adapter is suitable for being used as the charging voltage outputted by the second adapter in the second charging mode for charging the device to be charged (such as the terminal), and the reply instruction replying the second instruction can be configured to indicate the present output voltage of the second adapter is suitable, high or low. When the present output voltage of the second adapter matches with the present voltage of the battery or the present output voltage of the second adapter is suitable for being used as the charging voltage outputted by the second adapter in the second charging mode for charging the device to be charged (such as the terminal), it indicates that the present output voltage (or the peak value of the present output voltage) of the second adapter may be slightly higher than the present voltage of the battery, and a difference between the output voltage of the second adapter (or the peak value of the present output voltage) and the present voltage of the battery is within the predetermined range (typically in an order of hundreds of millivolts).

In some embodiments, the control unit may perform the bidirectional communication with the device to be charged (such as the terminal) to control the output of the second adapter in the second charging mode as follows. The control unit performs the bidirectional communication with the device to be charged (such as the terminal) to determine the charging current outputted by the second adapter in the second charging mode for charging the device to be charged (such as the terminal). The control unit adjusts the output current of the second adapter (or a peak value of the output current of the second adapter), such that the output current of the second adapter (or the peak value of the output current of the second adapter) is equal to the charging current outputted by the second adapter in the second charging mode for charging the device to be charged (such as the terminal).

In detail, the control unit performs the bidirectional communication with the device to be charged (such as the terminal) to determine the charging current outputted by the second adapter in the second charging mode for charging the device to be charged (such as the terminal) as follows. The control unit sends a third instruction to the device to be charged (such as the terminal), in which the third instruction is configured to query a maximum charging current presently supported by the device to be charged (such as the terminal). The control unit receives a reply instruction replying the third instruction and sent by the device to be charged (such as the terminal), in which the reply instruction replying the third instruction is configured to indicate the maximum charging current presently supported by the device to be charged (such as the terminal). The control unit determines the charging current outputted by the adapter in the second charging mode for charging the device to be charged (such as the terminal) according to the maximum charging current presently supported by the device to be charged (such as the terminal). It should be understood that, the control unit can determine the charging current outputted by the second adapter in the second charging mode for charging the device to be charged (such as the terminal) according to the maximum charging current presently supported by the device to be charged in many ways. For example, the second adapter can determine the maximum charging current presently supported by the device to be charged (such as the terminal) as the charging current (or the peak value of the charging current) outputted by the second adapter in the second charging mode for charging the device to be charged, or can determine the charging current outputted by the second adapter in the second charging mode for charging the device to be charged (such as the terminal) after comprehensively considering the maximum charging current presently supported by the device to be charged (such as the terminal) and its own current output capability.

In some embodiments, the control unit may perform the bidirectional communication with the device to be charged (such as the terminal) to control the output of the second adapter in the second charging mode as follows. During a charging process that the second adapter charges the device to be charged (such as the terminal) in the second charging mode, the control unit performs the bidirectional communication with the device to be charged (such as the terminal) to adjust the output current of the second adapter.

In detail, the control unit performs the bidirectional communication with the device to be charged (such as the terminal) to adjust the output current of the second adapter as follows. The control unit sends a fourth instruction to the device to be charged (such as the terminal), in which the fourth instruction is configured to query a present voltage of the battery in the device to be charged (such as the terminal). The control unit receives a reply instruction replying the fourth instruction sent by the second adapter, in which the reply instruction replying the fourth instruction is configured to indicate the present voltage of the battery. The control unit adjusts the output current of the second adapter according to the present voltage of the battery.

Figure 4A:
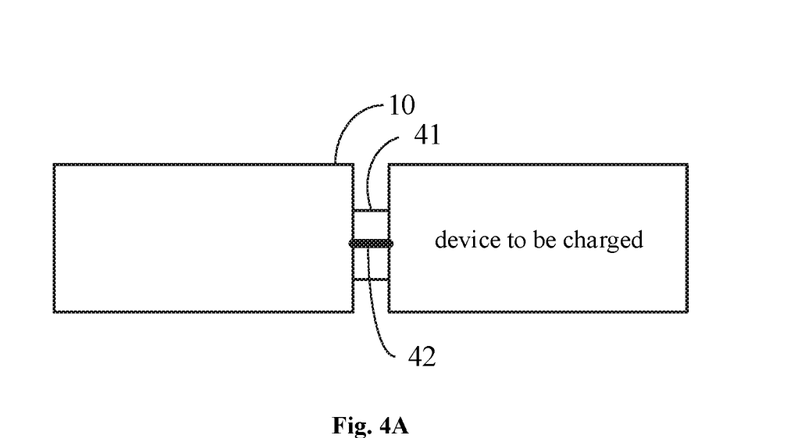
FIG. 4A is a schematic diagram illustrating a coupling between a device to be charged and a second adapter according to an embodiment of the present disclosure.

In some embodiments, as illustrated in FIG. 4A, the second adapter 10 includes a charging interface 41. Further, in some embodiments, the control unit in the second adapter 10 can perform the bidirectional communication with the device to be charged (such as the terminal) via a data wire 42 of the charging interface 41.

In some embodiments, the control unit may perform the bidirectional communication with the device to be charged (such as the terminal) to control the output of the second adapter in the second charging mode as follows. The control unit performs the bidirectional communication with the device to be charged (such as the terminal) to determine whether the charging interface is in poor contact.

In detail, the control unit performs the bidirectional communication with the device to be charged (such as the terminal) to determine whether the charging interface is in poor contact as follows. The control unit sends the fourth instruction to the device to be charged (such as the terminal), in which the fourth instruction is configured to query the present voltage of the battery in the device to be charged (such as the terminal). The control unit receives the reply instruction replying the fourth instruction and sent by the device to be charged (such as the terminal), in which the reply instruction replying the fourth instruction is configured to indicate the present voltage of the battery. The control unit determines whether the charging interface is in poor contact according to the output voltage of the second adapter and the present voltage of the battery in the device to be charged (such as the terminal). For example, when the control unit determines a difference between the output voltage of the second adapter and the present voltage of the battery in the device to be charged (such as the terminal) is greater than a predetermined voltage threshold, it indicates that an impedance obtained by dividing the voltage difference by the present current value outputted by the second adapter is greater than a preset impedance threshold, and thus it can be determined that the charging interface is in poor contact.

In some embodiments, it can be determined by the device to be charged (such as the terminal) whether the charging interface is in poor contact. The device to be charged (such as the terminal) sends a sixth instruction to the control unit, in which the sixth instruction is configured to query the output voltage of the second adapter. The device to be charged (such as the terminal) receives a reply instruction replying the sixth instruction, in which the reply instruction replying the sixth instruction is configured to indicate the output voltage of the second adapter. The device to be charged (such as the terminal) determines whether the charging interface is in poor contact according to the output voltage of the second adapter and the present voltage of the battery in the device to be charged (such as the terminal). After the device to be charged (such as the terminal) determines that the charging interface is in poor contact, the device to be charged (such as the terminal) sends a fifth instruction to the control unit, in which the fifth instruction is configured to indicate that the charging interface is in poor contact. After receiving the fifth instruction, the control unit can control the second adapter to quit the second charging mode.

Figure 4B:
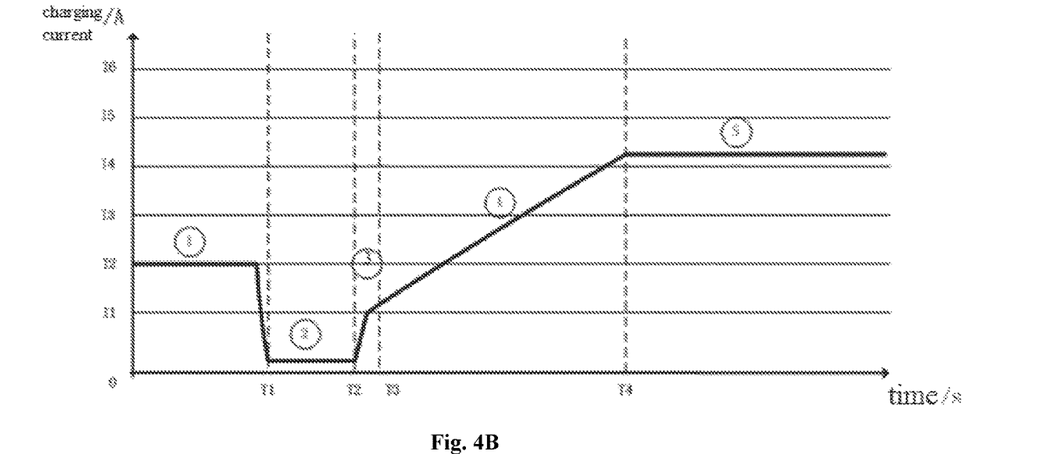
FIG. 4B is a schematic diagram illustrating a fast charging communication according to an embodiment of the present disclosure.

As illustrated in FIG. 4B, the communication procedure between the control unit in the second adapter and the device to be charged (such as the terminal) will be described in detail. It should be noted that, examples in FIG. 4B are merely used to help those skilled in the related art to understand embodiments of the present disclosure. The embodiments shall not be limited to the specific numeric values or specific scenes. Apparently, various modifications and equivalents can be made by those skilled in the related art based on examples in FIG. 4B, and those modifications and equivalents shall fall within the protection scope of the present disclosure.

As illustrated in FIG. 4B, the charging process that the second adapter charges the device to be charged (such as the terminal) in the second charging mode may include the following five stages.

Stage 1:

After the device to be charged (such as the terminal) is coupled to a power supply providing device, the device to be charged (such as the terminal) may detect a type of the power supply providing device via the data wires D+ and D−. When detecting that the power supply providing device is the second adapter, the device to be charged (such as the terminal) may absorb current greater than a predetermined current threshold I2, such as 1 A. When the control unit in the second adapter detects that the current outputted by the second adapter is greater than or equal to I2 within a predetermined time period (such as a continuous time period T1), the control unit determines that the device to be charged (such as the terminal) has completed the recognition of the type of the power supply providing device. The control unit initiates a negotiation between the second adapter and the device to be charged (such as the terminal), and sends an instruction 1 (corresponding to the above-mentioned first instruction) to the device to be charged (such as the terminal) to query whether the device to be charged (such as the terminal) agrees that the second adapter charges the device to be charged (such as the terminal) in the second charging mode.

When the control unit receives a reply instruction replying the instruction 1 from the device to be charged (such as the terminal) and the reply instruction replying the instruction 1 indicates that the device to be charged (such as the terminal) disagrees that the second adapter charges the device to be charged (such as the terminal) in the second charging mode, the control unit detects the output current of the second adapter again. When the output current of the second adapter is still greater than or equal to I2 within a predetermined continuous time period (such as a continuous time period T1), the control unit sends the instruction 1 again to the device to be charged (such as the terminal) to query whether device to be charged (such as the terminal) agrees that the second adapter charges the device to be charged (such as the terminal) in the second charging mode. The control unit repeats the above actions in stage 1, until the device to be charged (such as the terminal) agrees that the second adapter charges the device to be charged (such as the terminal) in the second charging mode or the output current of the second adapter is no longer greater than or equal to I2.

After the device to be charged (such as the terminal) agrees the second adapter to charge the device to be charged (such as the terminal) in the second charging mode, the communication procedure goes into stage 2.

Stage 2:

For the output voltage of the second adapter, there may be several levels. The control unit sends an instruction 2 (corresponding to the above-mentioned second instruction) to the device to be charged (such as the terminal) to query whether the output voltage of the second adapter (the present output voltage) matches with the present voltage of the battery in the device to be charged (such as the terminal).

The device to be charged (such as the terminal) sends a reply instruction replying the instruction 2 to the control unit, for indicating that the output voltage of the second adapter matches with the present voltage of the battery in the device to be charged (such as the terminal), or is higher or lower than the present voltage of the battery in the device to be charged (such as the terminal). When the reply instruction replying the instruction 2 indicates that the output voltage of the second adapter is higher, or lower, the control unit adjusts the output voltage of the second adapter by one level, and sends the instruction 2 to the device to be charged (such as the terminal) again to query whether the output voltage of the second adapter matches with the present voltage of the battery (such as the terminal). The above actions in stage 2 are repeated, until the device to be charged (such as the terminal) determines that the output voltage of the second adapter matches with the present voltage of the battery (such as the terminal). Then, the communication procedure goes into stage 3.

Stage 3:

The control unit sends an instruction 3 (corresponding to the above-mentioned third instruction) to the device to be charged (such as the terminal) to query the maximum charging current presently supported by the device to be charged (such as the terminal). The device to be charged (such as the terminal) sends a reply instruction replying the instruction 3 to the control unit for indicating the maximum charging current presently supported by the device to be charged (such as the terminal), and then the communication procedure goes into stage 4.

Stage 4:

The control unit determines the charging current outputted by the second adapter in the second charging mode for charging the device to be charged (such as the terminal) according to the maximum charging current presently supported by the device to be charged (such as the terminal). Then, the communication procedure goes into stage 5, i.e., the constant current charging stage.

Stage 5:

When the communication procedure goes into the constant current charging stage, the control unit sends an instruction 4 (corresponding to the above-mentioned fourth instruction) to the device to be charged (such as the terminal) at intervals to query the present voltage of the battery in the device to be charged (such as the terminal). The device to be charged (such as the terminal) may send a reply instruction replying the instruction 4 to the control unit, to feedback the present voltage of the battery in the device to be charged (such as the terminal). The control unit may determine according to the present voltage of the battery in the device to be charged (such as the terminal) whether the charging interface is in poor contact and whether it is necessary to decrease the peak value of the output current of the second adapter. When the second adapter determines that the charging interface is in poor contact, the second adapter sends an instruction 5 (corresponding to the above-mentioned fifth instruction) to the device to be charged (such as the terminal), and the second adapter quits the second charging mode and then the communication procedure is reset and goes into stage 1 again.

In some embodiments of the present disclosure, in stage 1, when the device to be charged (such as the terminal) sends the reply instruction replying the instruction 1, the reply instruction replying the instruction 1 may carry data (or information) of the path impedance of the device to be charged (such as the terminal). The data of the path impedance of the device to be charged (such as the terminal) may be used in stage 5 to determine whether the charging interface is in poor contact.

In some embodiments of the present disclosure, in stage 2, the time period from when the device to be charged (such as the terminal) agrees the second adapter to charge the device to be charged (such as the terminal) in the second charging mode to when the control unit adjusts the output voltage of the second adapter to a suitable value may be controlled in a certain range. If the time period exceeds a predetermined range, the second adapter or the device to be charged (such as the terminal) may determine that the fast charging communication procedure is abnormal, and is reset and goes into stage 1.

In some embodiments, in stage 2, when the output voltage of the second adapter is higher than the present voltage of the battery in the device to be charged (such as the terminal) by $\Delta V$ ($\Delta V$ may be set to 200-500 mV), the device to be charged (such as the terminal) may send a reply instruction replying the instruction 2 to the control unit, for indicating that the output voltage of the second adapter matches with the voltage of the battery in the device to be charged (such as the terminal).

In some embodiments of the present disclosure, in stage 4, the adjusting speed of the output current of the second adapter may be controlled to be in a certain range, thus avoiding an abnormity occurring in the charging process that the second adapter charges the device to be charged (such as the terminal) in the second charging mode due to the too fast adjusting speed.

In some embodiments of the present disclosure, in stage 5, the variation degree of the output current of the second adapter may be controlled to be less than 5%.

In some embodiments of the present disclosure, in stage 5, the control unit can monitor the path impedance of a charging loop in real time. In detail, the control unit can monitor the path impedance of the charging loop according to the output voltage of the second adapter, the output current of the second adapter and the present voltage of the battery fed back by the device to be charged (such as the terminal). When the path impedance of the charging loop is greater than a sum of the path impedance of the device to be charged (such as the terminal) and the impedance of the charging wire, it may be considered that the charging interface is in poor contact, and thus the second adapter stops charging the device to be charged (such as the terminal) in the second charging mode.

In some embodiments of the present disclosure, after the second adapter starts to charge the device to be charged (such as the terminal) in the second charging mode, time intervals of communications between the control unit and the device to be charged (such as the terminal) may be controlled to be in a certain range, thus avoiding abnormity in the communication procedure due to the too short time interval of communications.

In some embodiments of the present disclosure, the stop of the charging process (or the stop of the charging process that the second adapter charges the device to be charged (such as the terminal) in the second charging mode) may be a recoverable stop or an unrecoverable stop.

For example, when it is detected that the battery in the device to be charged (such as the terminal) is fully charged or the charging interface is poor contact, the charging process is stopped and the charging communication procedure is reset, and the charging process goes into stage 1 again. When the device to be charged (such as the terminal) disagrees that the second adapter charges the device to be charged (such as the terminal) in the second charging mode, the communication procedure would not go into stage 2. The stop of the charging process in such a case may be considered as an unrecoverable stop.

For another example, when an abnormity occurs in the communication between the control unit and the device to be charged (such as the terminal), the charging process is stopped and the charging communication procedure is reset, and the charging process goes into stage 1 again. After requirements for stage 1 are met, the device to be charged (such as the terminal) agrees that the second adapter charges the device to be charged (such as the terminal) in the second charging mode to recover the charging process. In this case, the stop of the charging process may be considered as a recoverable stop.

For another example, when the device to be charged (such as the terminal) detects that an abnormity occurs in the battery, the charging process is stopped and the charging communication process is reset, and the charging process goes into stage 1 again. The device to be charged (such as the terminal) disagrees that the second adapter charges the device to be charged (such as the terminal) in the second charging mode. When the battery returns to normal and the requirements for stage 1 are met, the device to be charged (such as the terminal) agrees that the second adapter charges the device to be charged (such as the terminal) in the second charging mode. In this case, the stop of fast charging process may be considered as a recoverable stop.

Communication actions or operations illustrated in FIG. 4B are merely exemplary. For example, in stage 1, after the device to be charged (such as the terminal) is coupled to the second adapter, the handshake communication between the device to be charged (such as the terminal) and the control unit may be initiated by the device to be charged (such as the terminal). In other words, the device to be charged (such as the terminal) sends an instruction 1 to query the control unit whether to operate in the second charging mode. When the device to be charged (such as the terminal) receives a reply instruction indicating that the second adapter agrees to charge the device to be charged (such as the terminal) in the second charging mode from the control unit, the second adapter starts to charge the battery in the device to be charged (such as the terminal) in the second charging mode.

For another example, after stage 5, there may be a constant voltage charging stage. In detail, in stage 5, the device to be charged (such as the terminal) may feedback the present voltage of the battery to the control unit. The charging process goes into the constant voltage charging stage from the constant current charging stage when the present voltage of the battery reaches a voltage threshold for constant voltage charging. During the constant current charging stage, the charging current decreases gradually. When the current reduces to a certain threshold, the charging process is stopped, and it indicates that the battery in the device to be charged (such as the terminal) is fully charged.

In some embodiments, the second adapter may directly apply the output current of the second adapter to both ends of the battery in the device to be charged (such as the terminal) for direct charging of the battery.

In detail, the direct charging refers to that, the output voltage and the output current of the second adapter are directly applied to (or directed to) both ends of the battery in the device to be charged (such as the terminal) for charging the battery in the device to be charged (such as the terminal), and it is unnecessary to provide a conversion circuit to convert the output current or the output voltage of the second adapter, thus avoiding energy loss during the conversion. During the charging process in the second charging mode, in order to be able to adjust the charging voltage or the charging current on the charging circuit, the second adapter may be designed as an intelligent adapter, and the second adapter realizes the conversion of the charging voltage or the charging current, thus relieving burden of the device to be charged (such as the terminal) and reducing heat generated in the device to be charged.

In embodiments of the present disclosure, the second adapter 10 may work in a constant current mode. The constant current mode herein means a charging mode in which the output current of the second adapter is controlled, while it is not required to keep the output current of the second adapter constant. In practice, the second adapter typically adopts a multi-stage constant current mode for charging during the constant current charging mode.

The multi-stage constant current charging may include N charging stages, where N is an integer no less than 2. The first charging stage of the multi-stage constant current charging starts with predetermined charging current. N constant charging stages in the multi-stage constant current charging are performed in sequence from the first charging stage to the $(N-1)^{th}$ charging stage. When the charging proceeds to a next charging stage from one charging stage, the charging current value reduces. When the voltage of the battery reaches a charging stop voltage threshold, the charging proceeds to a next charging stage from one charging stage.

Figure 5:
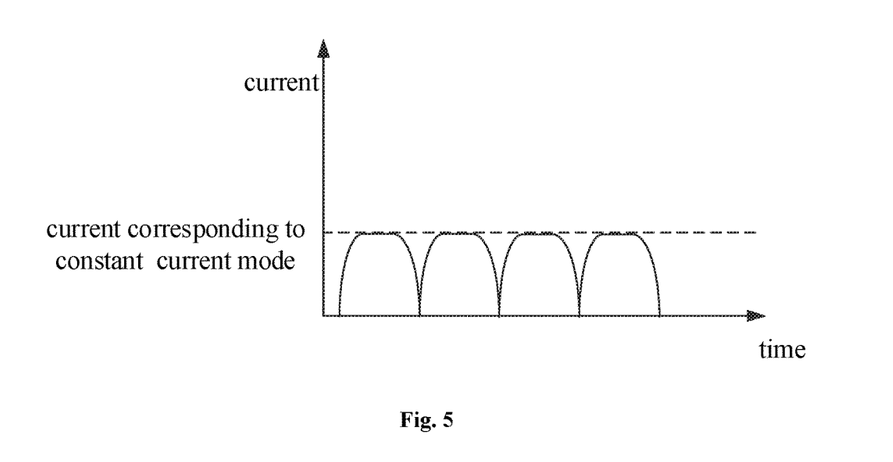
FIG. 5 is a schematic diagram illustrating a pulsating direct current in a constant current mode according to an embodiment of the present disclosure.

Further, when the output current of the second adapter is the pulsating direct current, the constant current mode may mean a charging mode in which the peak value of the pulsating direct current is controlled, i.e., the peak value of the output current of the second adapter does not exceed a current value corresponding to the constant current mode, as illustrated in FIG. 5.

The device embodiments of the present disclosure are described above in detail with reference to FIGS. 1-5. The method embodiments of the present disclosure will be described below in detail with reference to FIG. 6. It should be understood that, the description of method embodiments corresponds to the description of device embodiments, which are not elaborated herein for simplicity.

Figure 6:
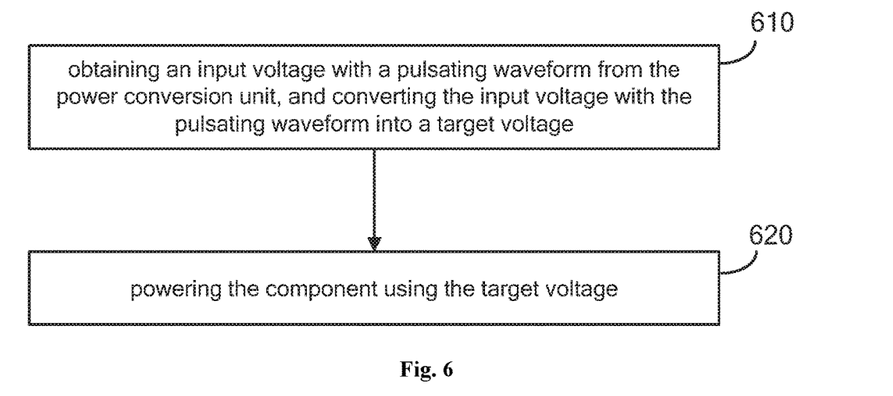
FIG. 6 is a flow chart illustrating a charging control method according to an embodiment of the present disclosure.

FIG. 6 is a flow chart of a charging control method according to embodiments of the present disclosure. The charging control method illustrated in FIG. 6 may be applied in the second adapter, such as the second adapter described in FIG. 1-FIG. 5. In detail, the second adapter includes a power conversion unit. The power conversion unit is configured to convert an input alternating current to obtain an output voltage and an output current of the adapter, in which the output current of the adapter is the alternating current or the pulsating direct current.

The charging control method illustrated in FIG. 6 may include the followings.

At block 610, an input voltage with a pulsating waveform is obtained from the power conversion unit, and the input voltage with the pulsating waveform is converted into a target voltage, in which a peak value of the target voltage is between a lowest operation voltage value and a highest operation voltage value of a component in the adapter.

At block 620, the component is powered using the target voltage.

In some embodiments, the power conversion unit includes a primary unit and a secondary unit, and obtaining the input voltage from the power conversion unit and converting the input voltage into the target voltage includes: converting a voltage with a pulsating waveform, which is coupled to the secondary unit from the primary unit, into the target voltage.

In some embodiments, converting the alternating voltage coupled to the secondary unit from the primary unit into the target voltage includes: rectifying a current of the secondary unit to obtain a pulsating current and voltage; and converting the pulsating voltage into the target voltage.

In some embodiments, the second adapter is configured to operate in a constant current mode.

In some embodiments, the second adapter includes a transformer, and a winding ratio of a primary winding and a secondary winding of the transformer is determined based on a peak value of the target voltage.

In some embodiments, the second adapter supports a first charging mode and a second charging mode. A charging speed of the second adapter charging the device to be charged in the second charging mode is greater than a charging speed of the second adapter charging the device to be charged in the first charging mode. The charging control method illustrated in FIG. 6 may further include: during the second adapter is coupled to the device to be charged, performing bidirectional communication with the device to be charged to control an output of the second adapter in the second charging mode.

In some embodiments, performing the bidirectional communication with the device to be charged to control the output of the second adapter in the second charging mode may include: performing the bidirectional communication with the device to be charged to negotiate a charging mode between the second adapter and the device to be charged.

In some embodiments, performing the bidirectional communication with the device to be charged to negotiate the charging mode between the second adapter and the device to be charged may include: sending a first instruction to the device to be charged, in which the first instruction is configured to query the device to be charged whether to operate in the second charging mode; receiving a reply instruction replying the first instruction and sent by the device to be charged, in which the reply instruction replying the first instruction is configured to indicate whether the device to be charged agrees to operate in the second charging mode; and charging the device to be charged in the second charging mode when the device to be charged agrees to operate in the second charging mode.

In some embodiments, performing the bidirectional communication with the device to be charged to control the output of the second adapter in the second charging mode may include: performing the bidirectional communication with the device to be charged to determine a charging voltage outputted by the second adapter in the second charging mode for charging the device to be charged; adjusting the output voltage of the second adapter such that the output voltage of the second adapter is equal to the charging voltage outputted by the second adapter in the second charging mode for charging the device to be charged.

In some embodiments, performing the bidirectional communication with the device to be charged to determine the charging voltage outputted by the second adapter in the second charging mode for charging the device to be charged may include: sending a second instruction to the device to be charged, in which the second instruction is configured to query whether the output voltage of the second adapter matches with a present voltage of the battery; and receiving a reply instruction replying the second instruction and sent by the device to be charged, in which the reply instruction replying the second instruction is configured to indicate that the output voltage of the second adapter matches with the present voltage of the battery, or is higher or lower than the present voltage of the battery.

In some embodiments, performing the bidirectional communication with the device to be charged to control the output of the second adapter in the second charging mode may include: performing the bidirectional communication with the device to be charged to determine a charging current outputted by the second adapter in the second charging mode for charging the device to be charged; adjusting the output current of the second adapter such that the output current of the second adapter is equal to the charging current outputted by the second adapter in the second charging mode for charging the device to be charged.

In some embodiments, performing the bidirectional communication with the device to be charged to determine the charging current outputted by the second adapter in the second charging mode for charging the device to be charged may include: sending a third instruction to the device to be charged, in which the third instruction is configured to query a maximum charging current presently supported by the device to be charged; receiving a reply instruction replying the third instruction and sent by the device to be charged, in which the reply instruction replying the third instruction is configured to indicate the maximum charging current presently supported by the device to be charged; and determining the charging current outputted by the second adapter in the second charging mode for charging the device to be charged according to the maximum charging current presently supported by the device to be charged.

In some embodiments, performing the bidirectional communication with the device to be charged to control the output of the second adapter in the second charging mode may include: during charging in the second charging mode, performing the bidirectional communication with the device to be charged to adjust the output current of the second adapter.

In some embodiments, performing the bidirectional communication with the device to be charged to adjust the output current of the second adapter may include: sending a fourth instruction to the device to be charged, in which the fourth instruction is configured to query the present voltage of the battery in the device to be charged; receiving a reply instruction replying the fourth instruction sent by the second adapter, in which the reply instruction replying the fourth instruction is configured to indicate the present voltage of the battery; and adjusting the output current of the second adapter according to the present voltage of the battery.

In some embodiments, the second adapter includes a charging interface, and performing the bidirectional communication with the device to be charged includes performing the bidirectional communication with the device to be charged via a data wire of the charging interface.

In some embodiments, the output voltage and the output current of the second adapter are directly applied to both ends of a battery of a device to be charged to perform direct charging of the battery.

In some embodiments, the second adapter includes a control unit configured to control a charging process, and the control unit is a microcontroller unit MCU.

In some embodiments, the second adapter includes a charging interface. The charging interface may be a universal serial bus interface.

It is to be understood that, the first adapter and the second adapter herein are for convenience of description only and are not intended to limit particular types of the adapter in the embodiments of the present disclosure.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present invention.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in electrical, mechanical or other manners.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, or a network device etc.) to execute all or some of steps of the method according to embodiments of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An adapter, comprising:
a power conversion unit, configured to convert an input alternating current to obtain an output voltage and an output current of the adapter, wherein the output current of the adapter is an alternating current or a pulsating direct current introduced into a battery for charging the battery;
a voltage holding unit, wherein an input end of the voltage holding unit is coupled to the power conversion unit, the voltage holding unit is configured to obtain an input voltage with a pulsating waveform from the power conversion unit and to convert the input voltage with the pulsating waveform into a target voltage, an output end of the voltage holding unit is coupled to a component in the adapter such that the component is powered by the target voltage, in which, a peak value of the target voltage is between a lowest operation voltage value and a highest operation voltage value of the component,
wherein the adapter is configured to support a first charging mode and a second charging mode, a charging speed of the adapter charging a device to be charged in the second charging mode is greater than a charging speed of the adapter charging the device to be charged in the first charging mode; and the adapter comprises a control unit, configured to perform bidirectional communication with the device to be charged during the adapter is coupled to the device to be charged to adjust the output current of the adapter, so as to control an output of the adapter in the second charging mode, in which,
the control unit is configured to send a first instruction to the device to be charged, in which the first instruction is configured to query a present voltage of a battery in the device to be charged;
the control unit is configured to receive a first reply instruction replying the first instruction sent by the adapter, in which the first reply instruction replying the first instruction is configured to indicate the present voltage of the battery; and
the control unit is configured to adjust the output current of the adapter according to the present voltage of the battery;
wherein the adapter is configured to acquire status information of the battery when the adapter is coupled to the battery, and to adjust the output voltage of the adapter according to the status information of the battery.

2. The adapter according to claim 1, wherein the power conversion unit comprises a primary unit and a secondary unit, the voltage holding unit is coupled to the secondary unit and configured to convert a voltage with a pulsating waveform, which is coupled to the secondary unit from the primary unit, into the target voltage to power the component.

3. The adapter according to claim 2, wherein the voltage holding unit comprises:
a rectifying unit, wherein an input end of the rectifying unit is coupled to the secondary unit, and the rectifying unit is configured to rectify a current of the secondary unit to obtain a pulsating current and voltage; and
a filter unit, wherein an input end of the filter unit is coupled to an output end of the rectifying unit and an output end of the filter unit is coupled to the component, and the filter unit is configured to convert the pulsating voltage into the target voltage and to supply power to the component based on the target voltage.

4. The adapter according to claim 3, wherein the rectifying unit comprises a diode, an anode of the diode is coupled to the secondary unit, and a cathode of the diode is coupled to the input end of the filter unit.

5. The adapter according to claim 3, wherein the filter unit comprises a capacitor, a first end of the capacitor is coupled to the output end of the rectifying unit and the component respectively, and a second end of the capacitor is grounded.

6. The adapter according to claim 3, wherein at least one of a capacity of the capacitor and the number of capacitors in the filter unit is determined based on power consumption of the component.

7. The adapter according to claim 1, wherein the adapter is configured to operate in a constant current mode.

8. The adapter according to claim 1, further comprising a transformer, wherein a winding ratio of a primary winding and a secondary winding of the transformer is determined based on a peak value of the target voltage.

9. The adapter according to claim 1, wherein when the control unit performs the bidirectional communication with the device to be charged to control the output of the adapter in the second charging mode,
the control unit is configured to perform the bidirectional communication with the device to be charged to negotiate a charging mode between the adapter and the device to be charged.

10. The adapter according to claim 9, wherein when the control unit performs the bidirectional communication with the device to be charged to negotiate the charging mode between the adapter and the device to be charged,
the control unit is configured to send a second instruction to the device to be charged, in which the second instruction is configured to query the device to be charged whether to operate in the second charging mode;
the control unit is configured to receive a second reply instruction replying the second instruction and sent by the device to be charged, in which the second reply instruction replying the second instruction is configured to indicate whether the device to be charged agrees to operate in the second charging mode; and
the control unit is configured to charge the device to be charged in the second charging mode when the device to be charged agrees to operate in the second charging mode.

11. The adapter according to claim 1, wherein when the control unit performs the bidirectional communication with the device to be charged to control the output of the adapter in the second charging mode,
the control unit is configured to perform the bidirectional communication with the device to be charged to determine a charging voltage outputted by the adapter in the second charging mode for charging the device to be charged; and
the control unit is configured to adjust the output voltage of the adapter, such that the output voltage of the adapter is equal to the charging voltage outputted by the adapter in the second charging mode for charging the device to be charged.

12. The adapter according to claim 11, wherein when the control unit performs the bidirectional communication with the device to be charged to determine the charging voltage outputted by the adapter in the second charging mode for charging the device to be charged,
the control unit is configured to send an additional instruction to the device to be charged, in which the additional instruction is configured to query whether the output voltage of the adapter matches with a present voltage of a battery in the device to be charged; and
the control unit is configured to receive an additional reply instruction replying the additional instruction and sent by the device to be charged, in which the additional reply instruction replying the additional instruction is configured to indicate that the output voltage of the adapter matches with the present voltage of the battery, or is higher or lower than the present voltage of the battery.

13. The adapter according to claim 1, wherein when the control unit performs the bidirectional communication with the device to be charged to control the output of the adapter in the second charging mode,
the control unit is configured to perform the bidirectional communication with the device to be charged to determine a charging current outputted by the adapter in the second charging mode for charging the device to be charged; and
the control unit is configured to adjust the output current of the adapter such that the output current of the adapter is equal to the charging current outputted by the adapter in the second charging mode for charging the device to be charged.

14. The adapter according to claim 13, wherein when the control unit performs the bidirectional communication with the device to be charged to determine the charging current outputted by the adapter in the second charging mode for charging the device to be charged,
the control unit is configured to send another instruction to the device to be charged, in which the another instruction is configured to query a maximum charging current presently supported by the device to be charged;
the control unit is configured to receive another reply instruction replying the another instruction and sent by the device to be charged, in which the another reply instruction replying the another instruction is configured to indicate the maximum charging current presently supported by the device to be charged; and
the control unit is configured to determine the charging current outputted by the adapter in the second charging mode for charging the device to be charged according to the maximum charging current presently supported by the device to be charged.

15. The adapter according to claim 1, comprising a charging interface, wherein the control unit is configured to perform the bidirectional communication with the device to be charged via a data wire of the charging interface.

16. The adapter according to claim 1, wherein the output voltage and the output current of the adapter are directly applied to both ends of a battery of a device to be charged to perform direct charging of the battery.

17. A charging control method, applied in an adapter, wherein the adapter comprises a power conversion unit configured to convert an input alternating current to obtain an output voltage and an output current of the adapter, the output current of the adapter being an alternating current or a pulsating direct current introduced into a battery for charging the battery, and the method comprises:
obtaining an input voltage with a pulsating waveform from the power conversion unit, converting the input voltage with the pulsating waveform into a target voltage, in which a peak value of the target voltage is between a lowest operation voltage value and a highest operation voltage value of a component in the adapter; and
powering the component using the target voltage,
wherein the adapter is configured to support a first charging mode and a second charging mode, a charging speed of the adapter charging a device to be charged in the second charging mode is greater than a charging speed of the adapter charging the device to be charged in the first charging mode; and the method further comprises:

performing bidirectional communication with the device to be charged during the adapter is coupled to the device to be charged to adjust the output current of the adapter, so as to control an output of the adapter in the second charging mode, comprising:
- sending an instruction to the device to be charged, in which the instruction is configured to query a present voltage of a battery in the device to be charged;
- receiving a reply instruction replying the instruction sent by the adapter, in which the reply instruction replying the instruction is configured to indicate the present voltage of the battery; and
- adjusting the output current of the adapter according to the present voltage of the battery;
- wherein the adapter is configured to acquire status information of the battery when the adapter is coupled to the battery, and to adjust the output voltage of the adapter according to the status information of the battery.

18. An adapter, comprising:

a power conversion unit, configured to convert an input alternating current to obtain an output voltage and an output current of the adapter, wherein the output current of the adapter is an alternating current or a pulsating direct current introduced into a battery for charging the battery;

a voltage holding unit, wherein an input end of the voltage holding unit is coupled to the power conversion unit, the voltage holding unit is configured to obtain an input voltage with a pulsating waveform from the power conversion unit and to convert the input voltage with the pulsating waveform into a target voltage, an output end of the voltage holding unit is coupled to a component in the adapter such that the component is powered by the target voltage, in which, a peak value of the target voltage is between a lowest operation voltage value and a highest operation voltage value of the component, wherein when the control unit performs the bidirectional communication with the device to be charged to control the output of the adapter in the second charging mode, the control unit is configured to perform the bidirectional communication with the device to be charged to determine at least one of a charging voltage and a charging current outputted by the adapter in the second charging mode for charging the device to be charged; and when the control unit is configured to perform the bidirectional communication with the device to be charged to determine the charging voltage, the control unit is configured to adjust the output voltage of the adapter, such that the output voltage of the adapter is equal to the charging voltage outputted by the adapter in the second charging mode for charging the device to be charged, in which, the control unit is configured to send an instruction to the device to be charged, in which the instruction is configured to query whether the output voltage of the adapter matches with a present voltage of a battery in the device to be charged; and the control unit is configured to receive a reply instruction replying the instruction and sent by the device to be charged, in which the reply instruction replying the instruction is configured to indicate that the output voltage of the adapter matches with the present voltage of the battery, or is higher or lower than the present voltage of the battery; and when the control unit is configured to perform the bidirectional communication with the device to be charged to determine the charging current, the control unit is configured to adjust the output current of the adapter such that the output current of the adapter is equal to the charging current outputted by the adapter in the second charging mode for charging the device to be charged, in which the control unit is configured to send an additional instruction to the device to be charged, in which the additional instruction is configured to query a maximum charging current presently supported by the device to be charged; the control unit is configured to receive an additional reply instruction replying the additional instruction and sent by the device to be charged, in which the additional reply instruction replying the additional instruction is configured to indicate the maximum charging current presently supported by the device to be charged; and the control unit is configured to determine the charging current outputted by the adapter in the second charging mode for charging the device to be charged according to the maximum charging current presently supported by the device to be charged wherein the adapter is configured to acquire status information of the battery when the adapter is coupled to the battery, and to adjust the output voltage of the adapter according to the status information of the battery.

* * * * *